United States Patent
Bedell et al.

(10) Patent No.: US 8,859,348 B2
(45) Date of Patent: Oct. 14, 2014

(54) STRAINED SILICON AND STRAINED SILICON GERMANIUM ON INSULATOR

(75) Inventors: Stephen W. Bedell, Wappingers Falls, NY (US); Kangguo Cheng, Schenectady, NY (US); Bruce Doris, Brewster, NY (US); Ali Khakifirooz, Mountain View, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 13/544,093

(22) Filed: Jul. 9, 2012

(65) Prior Publication Data

US 2014/0011328 A1    Jan. 9, 2014

(51) Int. Cl.
  *H01L 21/84*    (2006.01)
(52) U.S. Cl.
  USPC ..................... 438/154; 257/E21.7
(58) Field of Classification Search
  USPC ................. 438/154, 151, 149, 142
  See application file for complete search history.

(56) References Cited

U.S. PATENT DOCUMENTS

| | | | |
|---|---|---|---|
| 6,620,664 B2 | 9/2003 | Ma et al. | |
| 6,709,903 B2 | 3/2004 | Christiansen et al. | |
| 6,943,407 B2 | 9/2005 | Ouyang et al. | |
| 7,226,504 B2 | 6/2007 | Maa et al. | |
| 7,332,407 B2 * | 2/2008 | Wang et al. | 438/424 |
| 7,348,186 B2 | 3/2008 | Yoshida et al. | |
| 7,393,733 B2 * | 7/2008 | Currie | 438/164 |
| 7,615,471 B2 * | 11/2009 | Mantl | 438/479 |
| 8,048,220 B2 | 11/2011 | Mantl et al. | |
| 2003/0027406 A1 * | 2/2003 | Malone | 438/471 |
| 2011/0175166 A1 | 7/2011 | Bedell et al. | |
| 2013/0099318 A1 * | 4/2013 | Adam et al. | 257/351 |

OTHER PUBLICATIONS

H. Trinkaus et al., "Strain relaxation mechanism for hydrogen-implanted Si1-xGex/Si(100) heterostructures," Appl. Phys. Lett., vol. 76, 2000, 3552.

D. Buca et al., "Tensely strained silicon on SiGe produced by strain transfer," Appl. Phys. Lett., vol. 85, 2004, 2499.

* cited by examiner

*Primary Examiner* — Telly Green
*Assistant Examiner* — Damian A Hillman
(74) *Attorney, Agent, or Firm* — Thomas Grzesik; Fleit Gibbons Gutman Bongini & Bianco PL

(57) ABSTRACT

A method for fabricating field effect transistors patterns a strained silicon layer formed on a dielectric layer of a substrate into at least one NFET region including at least a first portion of the strained silicon layer. The strained silicon layer is further patterned into at least one PFET region including at least a second portion of the strained silicon layer. A masking layer is formed over the first portion of the strained silicon layer. After the masking layer has been formed, the second strained silicon layer is transformed into a relaxed silicon layer. The relaxed silicon layer is transformed into a strained silicon germanium layer.

16 Claims, 12 Drawing Sheets

STRAINED SILICON AND STRAINED SILICON GERMANIUM ON INSULATOR

FIELD OF THE INVENTION

The present invention generally relates to the field of semiconductors, and more particularly relates to strained Si and strained SiGe on insulator semiconductor devices.

BACKGROUND OF THE INVENTION

Strained silicon is being used by the semiconductor industry to improve transistor performance. Increased strain levels are desired in future technology nodes (e.g., 22 nm and beyond) to continue to improve transistor performance. In general, there are two methods to apply strain on devices: global and local strain engineering. Global biaxial tensile strain can be readily achieved by growing Si (silicon) on relaxed SiGe (silicon germanium) buffer layers, which are grown epitaxially on a Si wafer. However, biaxial tensile strain offers a small enhancement in transistor performance. Local strain engineering is the standard method to exert uniaxial tensile and compressive strain on n-channel and p-channel metal oxide semiconductor field effect transistors (MOSFETs), respectively. Uniaxial tensile strain can be obtained, for example, by depositing a nitride layer on the transistor or by forming embedded SiC (silicon carbide) source/drain structures. Uniaxial compressive strain is achieved by either depositing nitride layers or by embedded SiGe. However, both methods lose their effectiveness as the technology is scaled and the transistor pitch becomes smaller.

SUMMARY OF THE INVENTION

In one embodiment, a method for fabricating field effect transistors is disclosed. The method comprises patterning a strained silicon layer formed on a dielectric layer of a substrate into at least one NFET region comprising at least a first portion of the strained silicon layer. The strained silicon layer is further patterned into at least one PFET region comprising at least a second portion of the strained silicon layer. A masking layer is formed over the first portion of the strained silicon layer. After the masking layer has been formed, the second strained silicon layer is transformed into a relaxed silicon layer. The relaxed silicon layer is transformed into a strained silicon germanium layer.

In another embodiment, another method for fabricating field effect transistors is disclosed. The method comprises patterning a strained silicon layer formed on a dielectric layer of a substrate into a plurality of NFET regions. Each of the plurality of NFET regions comprises a portion of the strained silicon layer. The strained silicon layer is patterned into a plurality of PFET regions. Each of the plurality of PFET regions comprises a portion of the strained silicon layer. Each of a subset of the portions of the strained silicon layer in the plurality of NFET regions and each of the portions of the strained silicon layer in the plurality of PFET regions is transformed into a relaxed silicon layer. A subset of the relaxed silicon layers in the plurality of PFET regions is transformed into a strained silicon germanium layer.

Other objects, features, and advantages of the present invention will become apparent from the following detailed description. It should be understood, however, that the detailed description and specific examples, while indicating various embodiments of the present invention, are given by way of illustration only and various modifications may naturally be performed without deviating from the present invention.

DETAILED DESCRIPTION

Global substrate induced strain is a promising method for strain engineering in future nodes where local strain engineering such as embedded stressors and stress liners are not very effective. Strained silicon-on-insulator (SSOI) wafers can be used to enhance NFET performance whereas strained SiGe-on-insulator (SSGOI) can be used to improve PFET performance. However, to take the most advantage of these materials, the strain semiconductor layer has to be patterned into narrow islands so that the transverse strain component is relaxed. Strained SiGe layers can be formed by starting from a relaxed SOI wafer, epitaxially growing a SiGe layer and thermal mixing (that might involve some oxidation) to convert the whole semiconductor layer into SiGe under compressive stress. However, forming the strained SiGe on SSOI wafers is not straightforward because the silicon layer is initially lattice matched to SiGe (typically 20-30%). If SSOI is used as a starting material for SGOI formation the final material is not stained unless the final composition is greater than the equivalent Ge in the SSOI layer. In other words, if the donor material for SSOI wafer has a lattice constant matched to a $Si_{1-x}Ge_x$ layer and the final SiGe layer has a composition of $Si_{1-y}Ge_y$, the final SiGe material is under compressive stress only when y>x. In this situation, the strain is equivalent to the SiGe layer with a Ge content of y-x that is formed on relaxed SOI.

Figure 1:
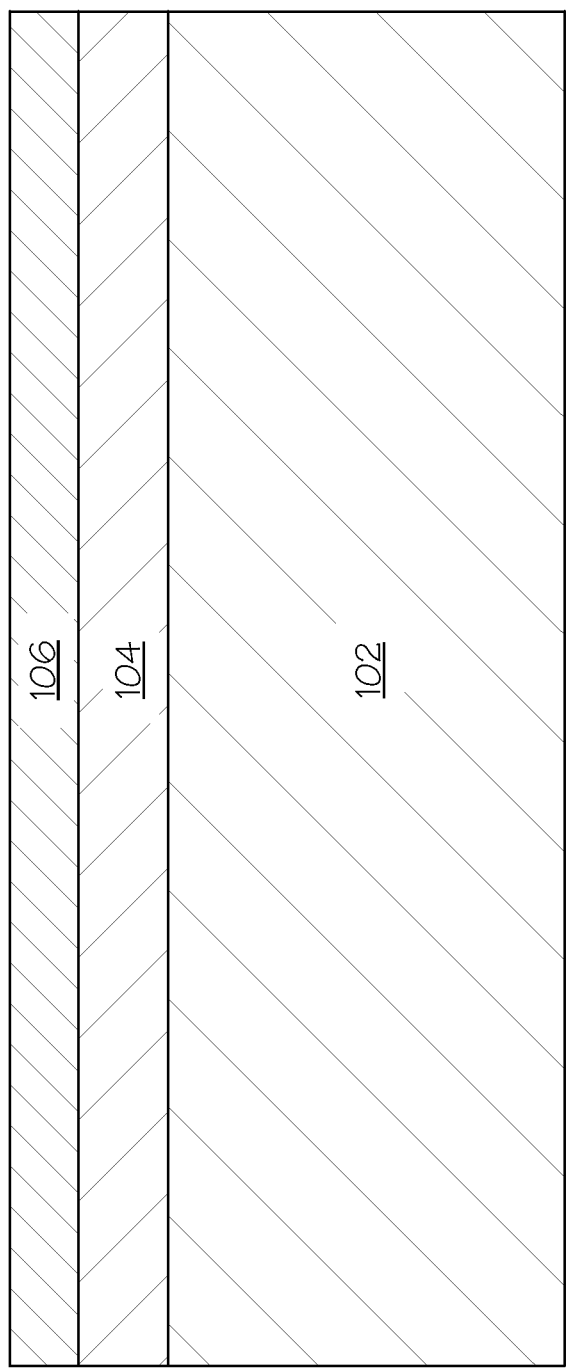
FIG. 1 is a cross-sectional view of a semiconductor structure after a first semiconductor layer has been formed on a buried insulator layer according to a first embodiment of the present invention.

Therefore, one or more embodiments of the present invention provide a method for forming strained Si and strained SiGe layers on the same wafer, as shown in FIGS. 1-6. As shown in FIG. 1, there is provided an SOI wafer having a substrate 102 comprising bulk silicon, germanium, gallium arsenide, or any other substrate material. On the substrate 102, a dielectric layer 104 is formed or grown. The dielectric layer 104, in one embodiment, comprises a buried oxide layer (BOX) or other dielectric material. A strained semiconductor material 106 is provided on the dielectric layer 104. In one embodiment, the strained semiconductor material 106 includes a biaxially tensile strained silicon layer. Other strained layers having different or the same materials may also be employed in accordance with the present principles. In one embodiment, a global biaxial tensile strain in a strained-silicon directly on insulator (SSDOI) structure is converted to a uniaxial tensile strain for n-channel transistors to enhance electron mobility and relaxed for p-channel transistors, so that uniaxial compressive strain can be effectively applied to p-channel transistors.

The starting material, in one embodiment, is a biaxially strained silicon-on-insulator 106, which is usually fabricated by growing silicon (Si) on relaxed silicon germanium (SiGe) buffer layers, wafer bonding, and subsequent removal of the Si substrate and SiGe layer. Such wafers are commercially available. For devices targeted for 22 nm node and beyond, the thickness of the strained layer 106 may be about 5-30 nm. Usually Ge content in a SiGe buffer layer is 20-30%, but higher Ge content is possible.

Figure 2:
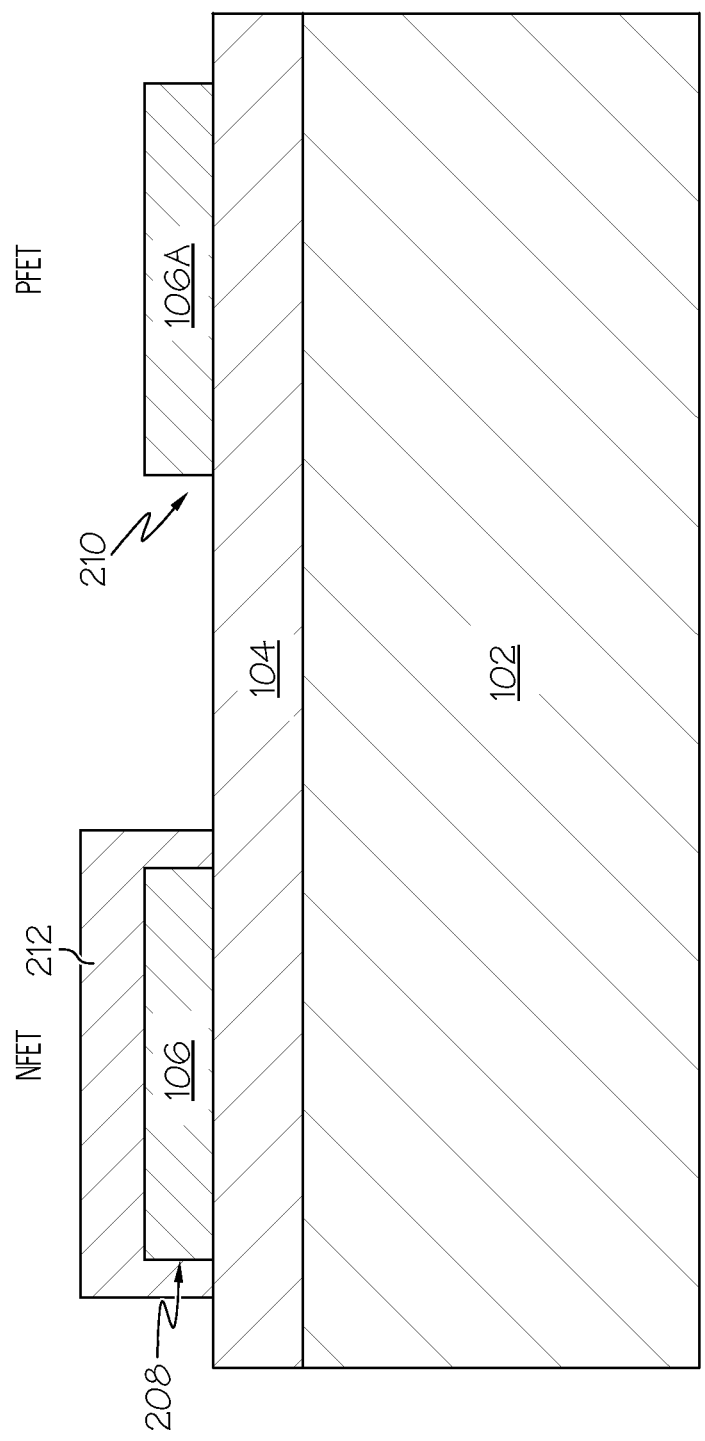
FIG. 2 is a cross-sectional view of the semiconductor structure of FIG. 1 after the first semiconductor layer has been patterned into NFET and PFET regions according to the first embodiment of the present invention.

Referring to FIG. 2, to convert the global biaxial tensile strain of layer 106 into uniaxial tensile strain, the strained silicon layer 106 is patterned into NFET and PFET islands/regions 208, 210 with length much larger than width and height. For planar structures, a set of long and narrow (e.g., having a width less than about 300 nm) islands 208 and 210 are patterned where NFETs and PFETs are fabricated, respectively. Such processing includes, for example, depositing mask layers, patterning these layers, and etching the material to form the islands 208 and 210, simultaneously. Since the long islands 208 and 210 maintain their length, a uniaxial strain is maintained in the long dimension direction (which is perpendicular to the dashed line 209 shown in FIG. 2), but not in the width. In one embodiment, both NFET and PFET devices are fabricated on long and narrow islands. For a PFET device the strain is first relaxed and then converted into compressive strain along the length of the island when SiGe is formed. However, in another embodiment, long and narrow islands are not required. In an embodiment where the islands are not narrow the strain is biaxial.

A blocking/masking layer 212 is deposited over the NFET region(s) 208, while the PFET region 210 remains exposed, as shown in FIG. 2. The blocking/masking layer 212, in one embodiment, comprises a photoresist material or a hardmask such as silicon nitride, oxide, oxinitride, or any other material capable of preventing implantation ions from reaching the silicon material 106 of the island 208 and/or the interface between the strained silicon layer 106 and the dielectric layer 104 during a subsequent implantation process.

Figure 3:
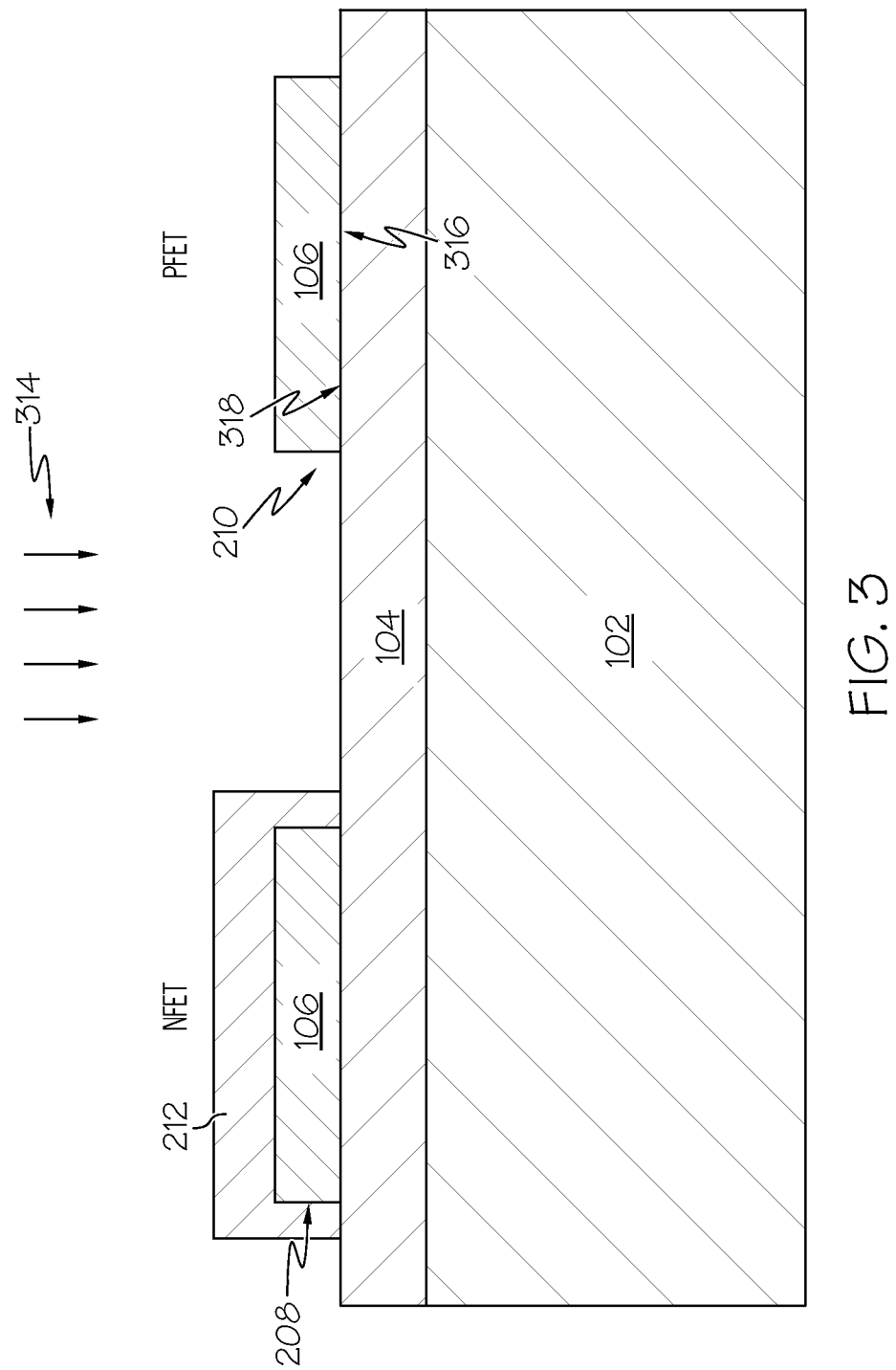
FIG. 3 shows a ion implantation process being performed on the semiconductor structure of FIG. 2 according to the first embodiment of the present invention.

FIG. 3 shows that ion implantation 314 is performed to relax the strain in the of the strained Si layer 106 in the PFET region 210 with an energy and dose optimized to reach the interface 318 between the strained silicon layer 106 and the dielectric layer 104. In one embodiment, the ion implantation is hydrogen, helium, or a combination of both and at a dose of $5 \times 10^{15}$ to $5 \times 10^{16}$ cm$^{-2}$. However, other doses are applicable as well. The ion energy is chosen so that the peak of the implanted ions is located near the interface 318 between the strained Si layer 106 and the dielectric 104. The ion energy, in one embodiment, is 500 eV to 5 keV. However, other energies are applicable as well. The ion implantation can be performed at around room temperature or at a different temperature. The blocking/mask layer 212 formed on the NFET region 208 prevents implanted ions from reaching the strained Si layer 106 in the NFET region 208. An annealing (thermal) step is performed, which relaxes any remaining stress in the PFET region 210. The annealing step can be performed in a furnace, using rapid thermal annealing (RTA) or any other method. For example, the annealing step can be performed at a temperature of about 1050° C., for a time of about 1 second to about 5 seconds. Alternatively, the annealing step can be combined with subsequent annealing steps during device processing.

Figure 4:
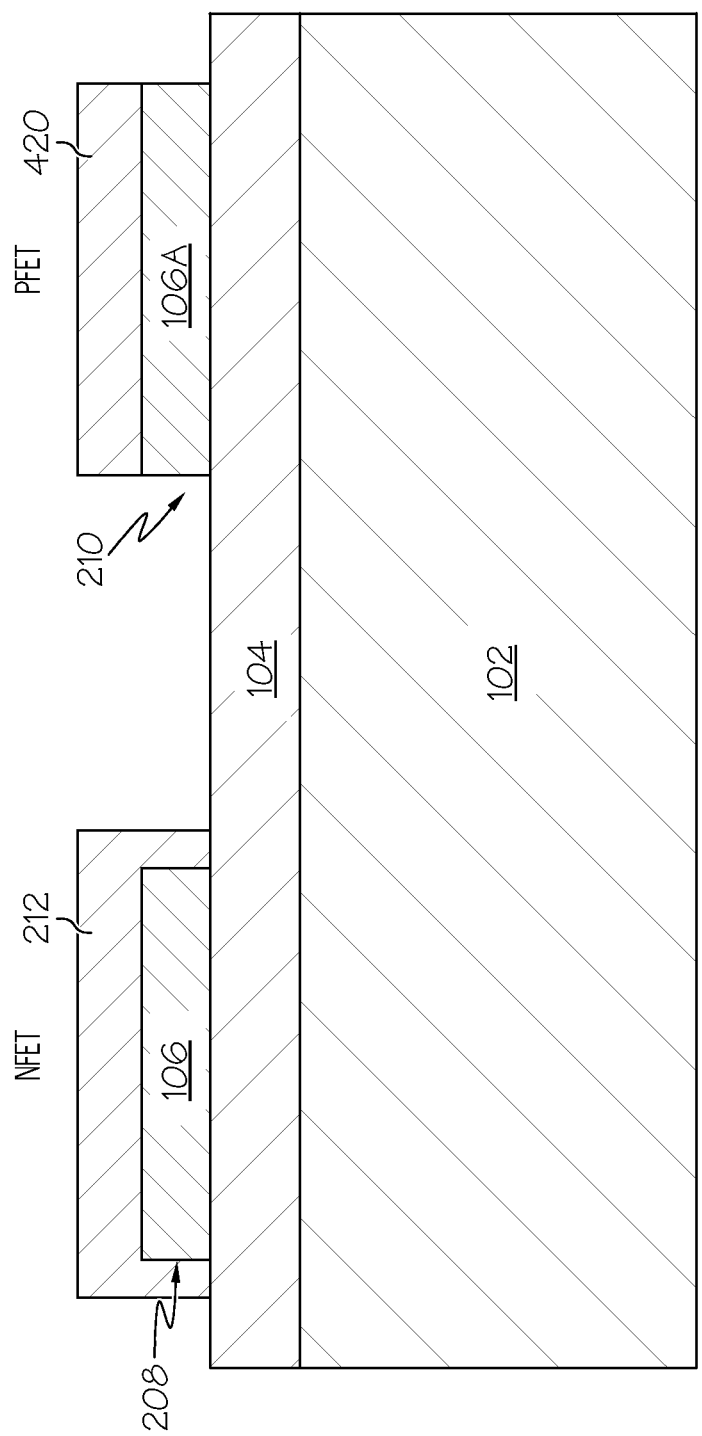
FIG. 4 is a cross-sectional view of the semiconductor structure of FIG. 3 after an SiGe layer has been formed on a relaxed Si layer in the PFET region of the structure according to the first embodiment of the present invention.
Figure 5:
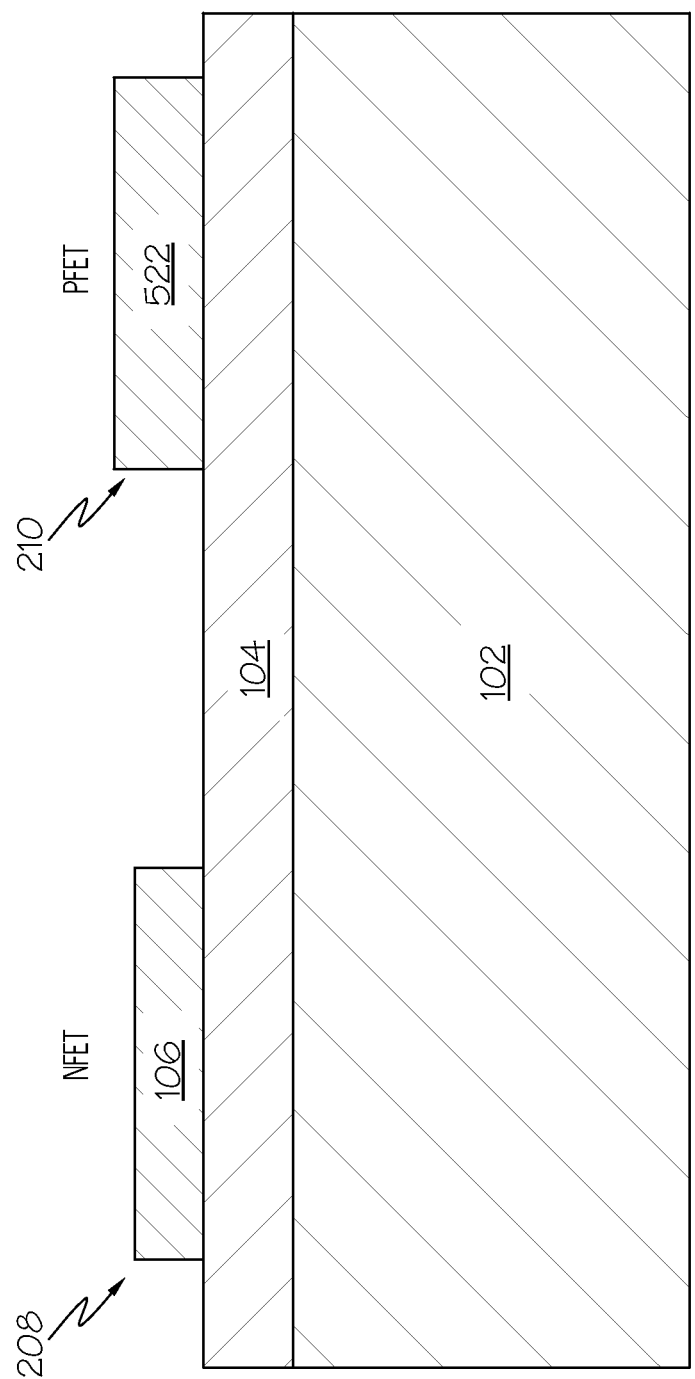
FIG. 5 is a cross-sectional view of the semiconductor structure of FIG. 3 after the SiGe/Si layer has been converted into a strained SiGe layer according to the first embodiment of the present invention.
Figure 6:
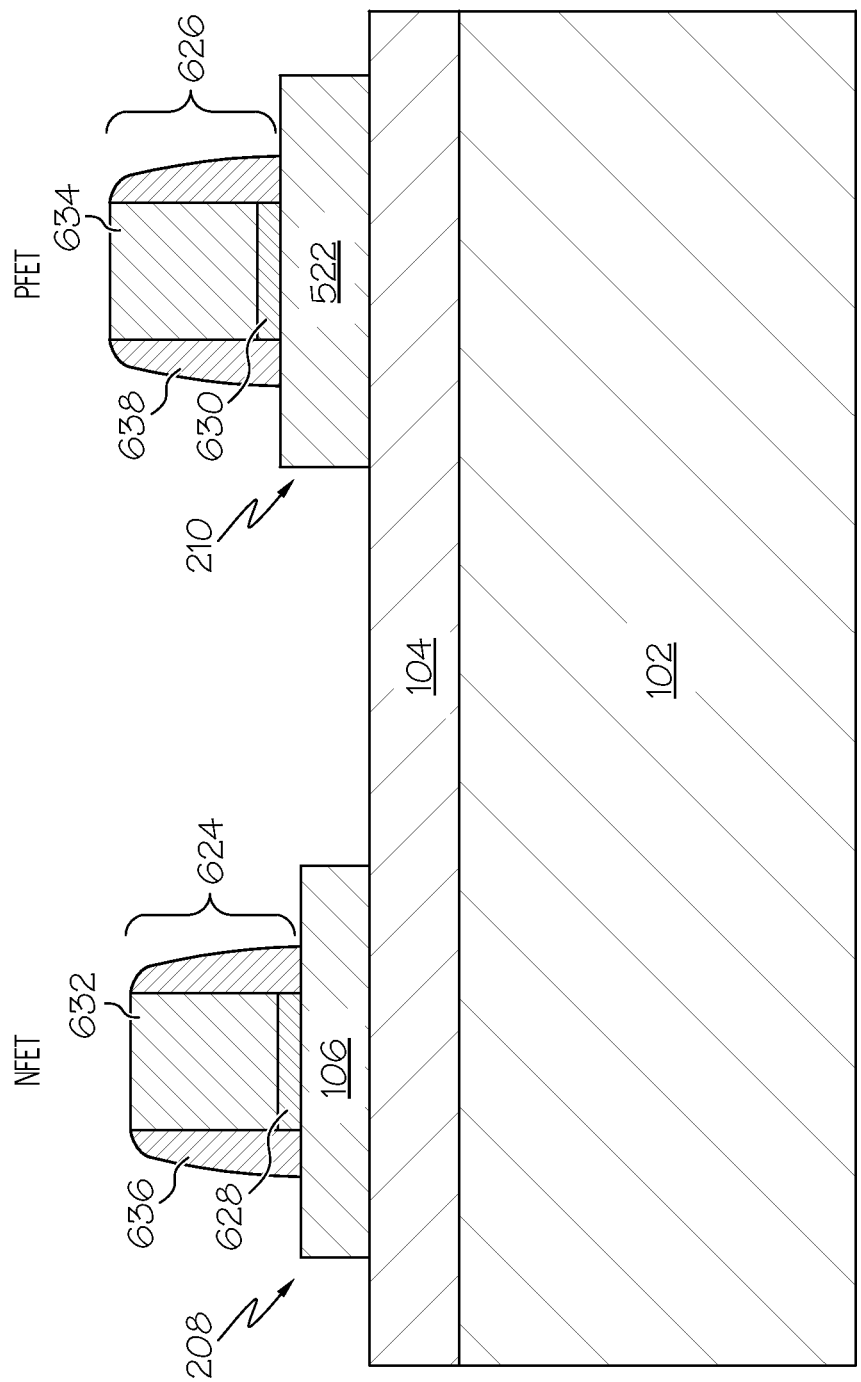
FIG. 6 is a cross-sectional view of the semiconductor structure of FIG. 4 after the a gate stack and spacer have been formed in the NFET and PFET regions according to the first embodiment of the present invention.

A SiGe layer 420 is epitaxially grown in the PFET region 208, as shown in FIG. 4. For example, a selective epitaxy process can be used to grow silicon germanium on the exposed silicon surface of the relaxed silicon layer 106A of the PFET region 210, but does not grow silicon germanium on dielectric layers, such as nitride or oxide. One or more processes are performed to convert the SiGe layer 420 and the relaxed silicon layer 106A to a compressively strained SiGe layer 522, as shown in FIG. 5. For example, a thermal mixing process, in one embodiment, is used in which the SiGe layer 420 and the relaxed silicon layer 106A are annealed in an inert ambient at a temperature (and duration) that allows for interdiffusion of Ge in the SiGe layer 420 throughout the relaxed Si layer 106A. In this embodiment a capping layer such as silicon nitride, silicon oxide or other dielectrics is formed over the SiGe layer 420 and relaxed Si layer 106 before the intermixing annealing step is performed. In another example, a condensation process is performed to convert the SiGe layer 420 and the relaxed silicon layer 106A to the compressively strained SiGe layer 522. During the condensation process, annealing is performed in an oxidizing ambient such as an ambient that contains oxygen, NO, $N_2O$, $H_2O$, or ozone. The SiGe layer 420 is oxidized, which drives Ge atoms from the SiGe layer 420 into the relaxed silicon layer 106A. The oxidize layer is then removed using, for example, a wet etch process, such as etching in HF, thereby leaving only the SiGe layer 522 in the PFET region 210. Since Ge lattice constant is larger than that of Si, SiGe layer 522 is under compressive strain.

The blocking/mask layer 212 is removed as shown in FIG. 5. As can be seen, the wafer comprises strained Si 106 in the NFET region 208 and strained SiGe 522 in the PFET region 210. The thickness of the strained SiGe 522 can be equal to, less than, or greater than the thickness of the strained Si layer 106. Device fabrication is then continued as in conventional CMOS processes. For example, a gate 624, 626 is formed by deposition of a gate dielectric 628, 630 and gate material 632, 634 on the active regions 106, 522, through conventional deposition and etching processes. In one embodiment, the gate dielectric 628, 630 can be oxide, hafnium oxide or other high-k dielectric or combination thereof, depending on the designed performance. The gate material 632, 634, in one embodiment, can be a polycrystalline semiconductor material, such as polysilicon, a metal layer such as TiN, Al, W, AlN, TaN, TaAlN, a semiconductor-metal alloy such as nickel silicide, or a combination of these. Spacers 636, 638 can be for example SiN, silicon oxynitride, SiBN, or SiCBN.

In one or more embodiments, since strained Si and SiGe devices have lower threshold voltage than relaxed Si, multiple threshold voltage (Vt) devices are obtained on the same wafer without need to different gate stacks or implants to adjust Vt. For example, a NFET with strained Si channel has a Vt that is 50-200 mV smaller than a NFET with relaxed Si channel. Also, because the NFET region comprises strained Si and the PFET region comprises strained SiGe the resulting structure shown in FIG. 6 comprises high performance NFETs in the strained Si region and high performance PFETs on the strained SiGe on the same wafer. A high performance NFET is an NFET where electron mobility is higher than that of a NFET with relaxed Si channel, also known as universal electron mobility. A high performance PFET is a PFET with hole mobility higher than that of a PFET with relaxed Si channel, also known as universal hole mobility. For example electron mobility in the high performance NFET can be between 70-100% higher than electron mobility in a relaxed NFET and the hole mobility in the high performance PFET can be 20-300% higher than the hole mobility in a relaxed PFET. Consequently, the drive current of the NFET fabricated on strained Si region 208 and PFET fabricated on strained SiGe region 210 are higher than similar devices fabricated on relaxed Si.

Figure 7:
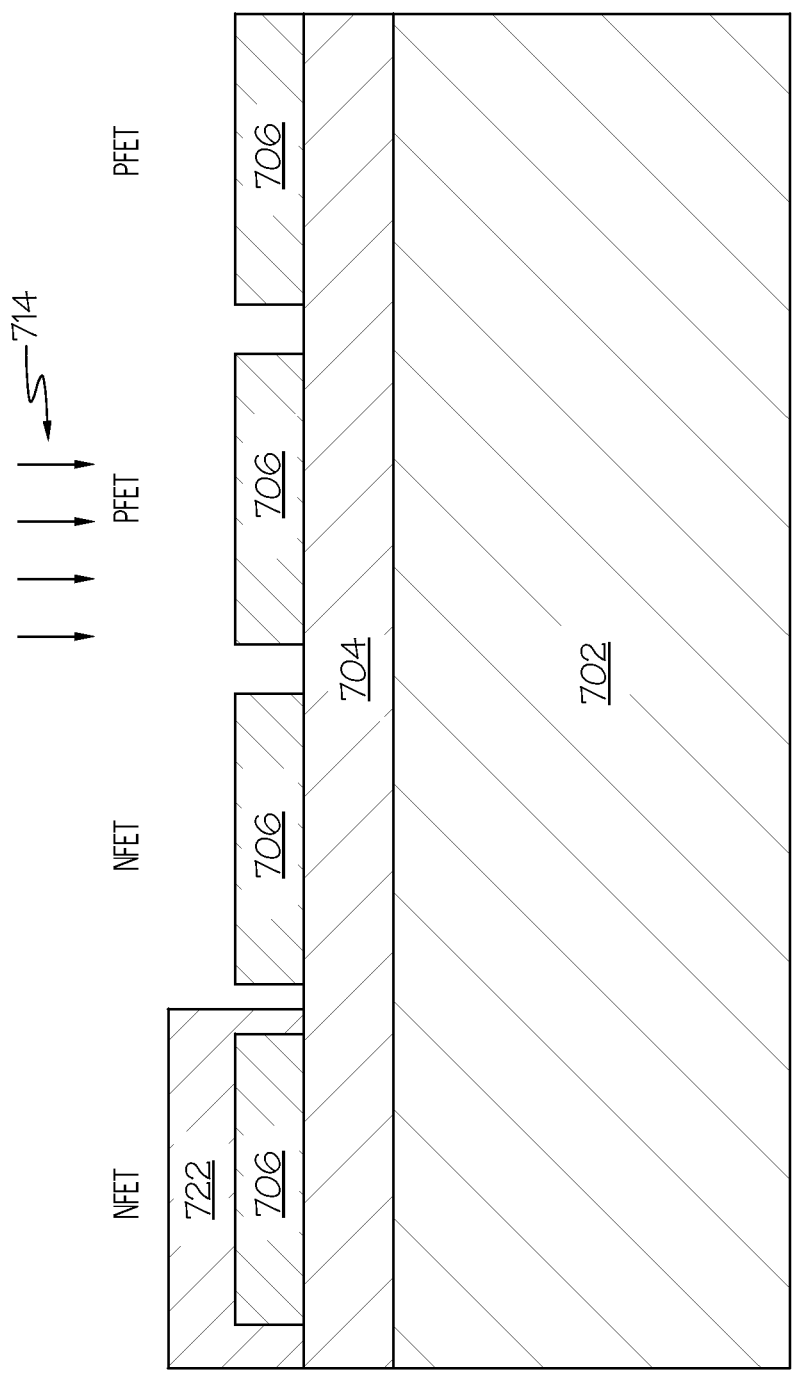
FIG. 7 is a cross-sectional view of the semiconductor structure of FIG. 1 after a semiconductor layer has been patterned into multiple NFET and PFET regions and an ion implantation process has been performed according to a second embodiment of the present invention.

In addition to the embodiments above, FIGS. 7-12 illustrate a process for fabricating both high performance and low power NFETs and high performance and low power PFETs on the same wafer. In particular, FIG. 7 shows an SOI wafer similar to that of FIG. 1. For example, the SOI wafer of FIG. 7 comprises a substrate 702, a dielectric (BOX) layer 704, and a strained semiconductor material 706 such as a strained Si layer. FIG. 7 also shows that a plurality of islands/regions have been formed for NFETs and PFETs, similar to that discussed above with respect to FIG. 2. A blocking/mask layer 712 similar to the blocking layer/mask 212 of FIG. 2 is formed over a subset of the NFET regions. Stated differently, the blocking/mask layer 712 is formed over a subset of the strained Si layers 706 in the NFET regions. An implantation process 714 similar to the process discussed above with respect to FIG. 3 is performed to relax the exposed Si layers 106 in the NFET and PFET regions that are not covered by the blocking mask 712.

Figure 8:
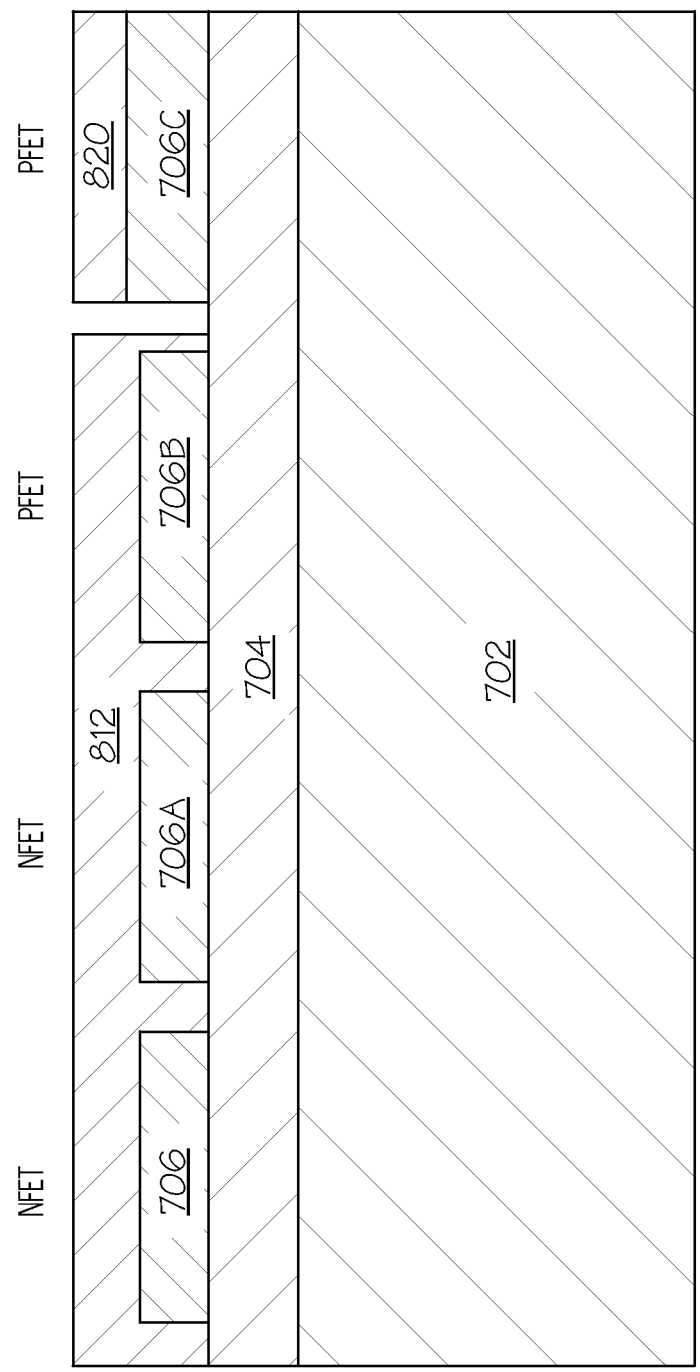
FIG. 8 is a cross-sectional view of the semiconductor structure of FIG. 7 after an SiGe layer has been formed on a relaxed Si layer in one of the PFET regions of the structure according to the second embodiment of the present invention.
Figure 9:
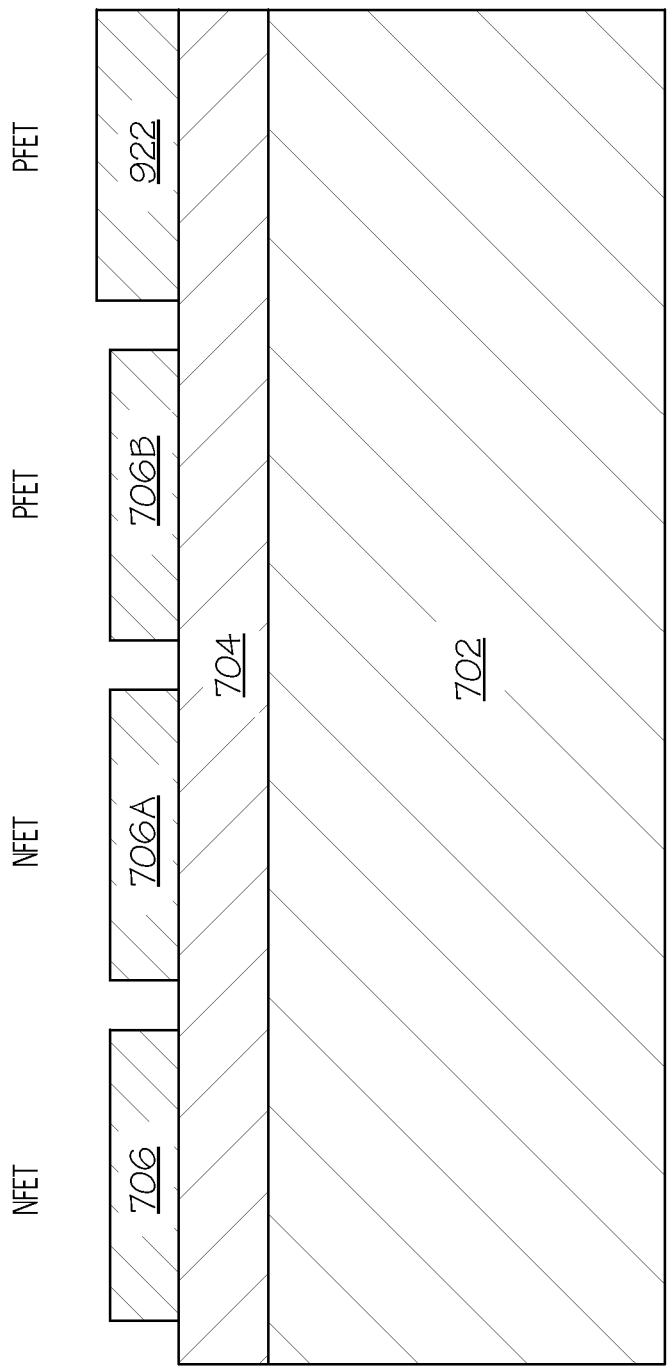
FIG. 9 is a cross-sectional view of the semiconductor structure of FIG. 8 after the SiGe/Si layer has been converted into a strained SiGe layer according to the second embodiment of the present invention.
Figure 10:
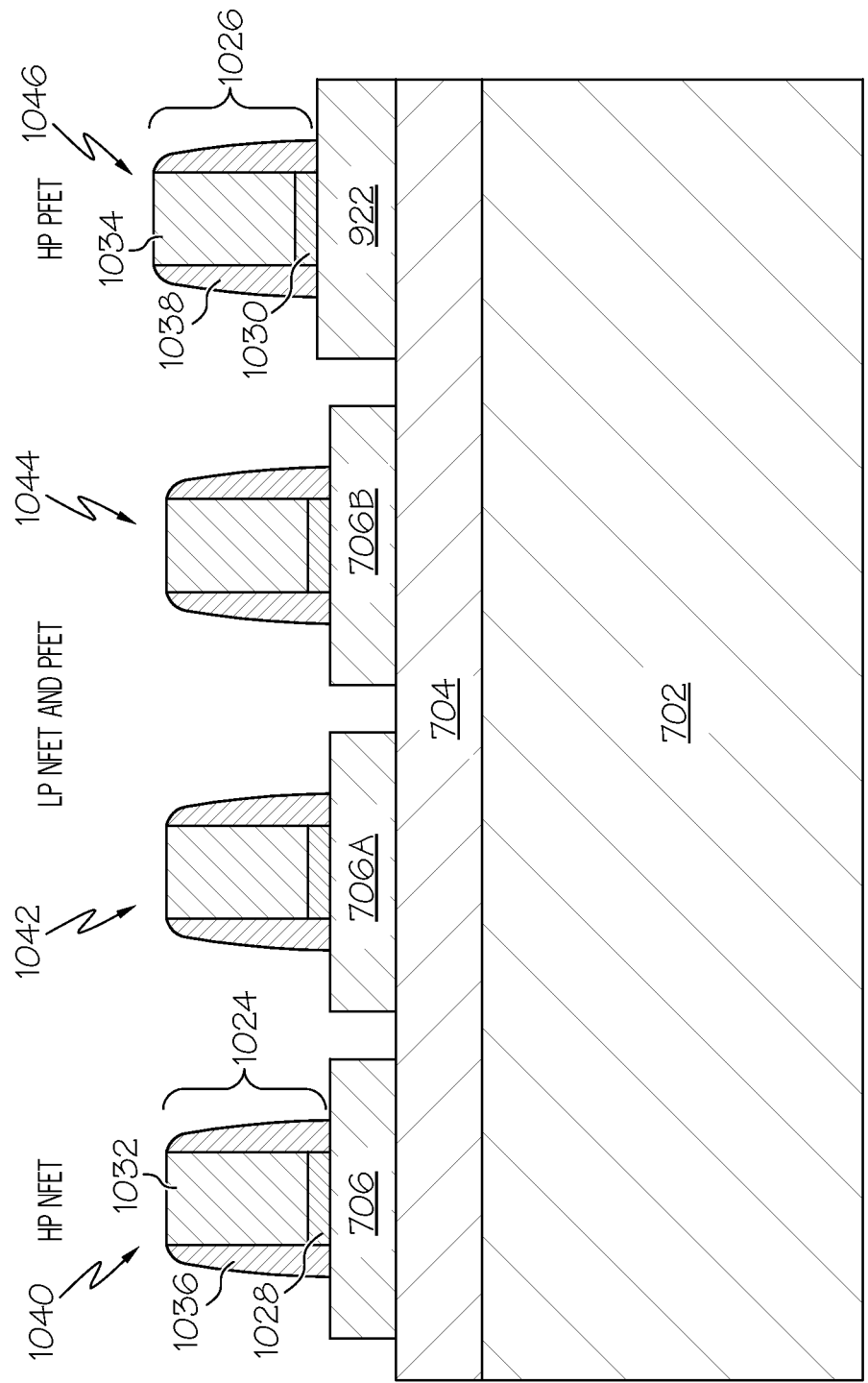
FIG. 10 is a cross-sectional view of the semiconductor structure of FIG. 9 after the a gate stack and spacer have been formed in each of the NFET and PFET regions according to the first embodiment of the present invention.

FIG. 8 shows that a blocking layer/mask 812 is formed over the exposed relaxed Si layers 706A of the NFET regions and a subset of the exposed relaxed Si layers 706B of the PFET regions. A SiGe layer 820 is then epitaxially grown on the exposed relaxed Si layer 706C in the PFET region, similar to that discussed above with respect to FIG. 5. One or more processes are performed to convert the SiGe layer 820 and the relaxed silicon layer 706C to a compressively strained SiGe layer 922, as shown in FIG. 9. For example, thermal mixing or condensation processes can be performed to form compressively strained SiGe layer 922, similar to the process discussed above with respect to FIG. 5.

The blocking/mask layer 812 and any oxide layer formed in/on the NFET region and on the subset of the PFET regions comprising the blocking/mask layer 812 is removed resulting in one or more strained Si layers 706 in the NFET region, one or more relaxed Si layers 706A in the NFET region, one or more relaxed Si layers 706B in the PFET region, and one or more strained SiGe layers 922 in the PFET region. Device fabrication is then continued as in conventional CMOS processes. For example, a gate 1024, 1026 is formed by deposition of a gate dielectric 1028, 1030 and gate material 1032, 1034 on the active regions 706, 706A, 706B, 922 of each of the NFET and PFET devices, through conventional deposition and etching processes. In one embodiment, the gate dielectric 1028, 1030 can be oxide, hafnium oxide or other high-k dielectric or combination thereof, depending on the designed performance. The gate material 1032, 1034, in one embodiment, can be a polycrystalline semiconductor material, a metal, a semiconductor metal alloy, or a combination of these, with nitride spacers 1036, 1038. The resulting wafer comprises both a high performance and low power NFETs 1040, 1042 and high performance and low power PFETs 1044, 1046 on the same wafer.

For example, the threshold voltage of the NFET fabricated on the strained Si region 706 is 50-200 mV smaller than the NFET fabricated on the relaxed Si region 706B. As a result, the off current of the transistor fabricated on the relaxed Si region 706B is 1-2 orders of magnitude smaller than the transistor fabricated on the strained region 706. Similarly, the threshold voltage of the PFET fabricated on the strained SiGe region 922 is 50-400 mV smaller than the threshold voltage of the PFET fabricated on the relaxed Si region 706B. Subsequently, the leakage current of the transistor fabricated on the relaxed Si region 706B is 1-2 orders of magnitude smaller than the PFET fabricated on the strained SiGe region 922.

Figure 11:
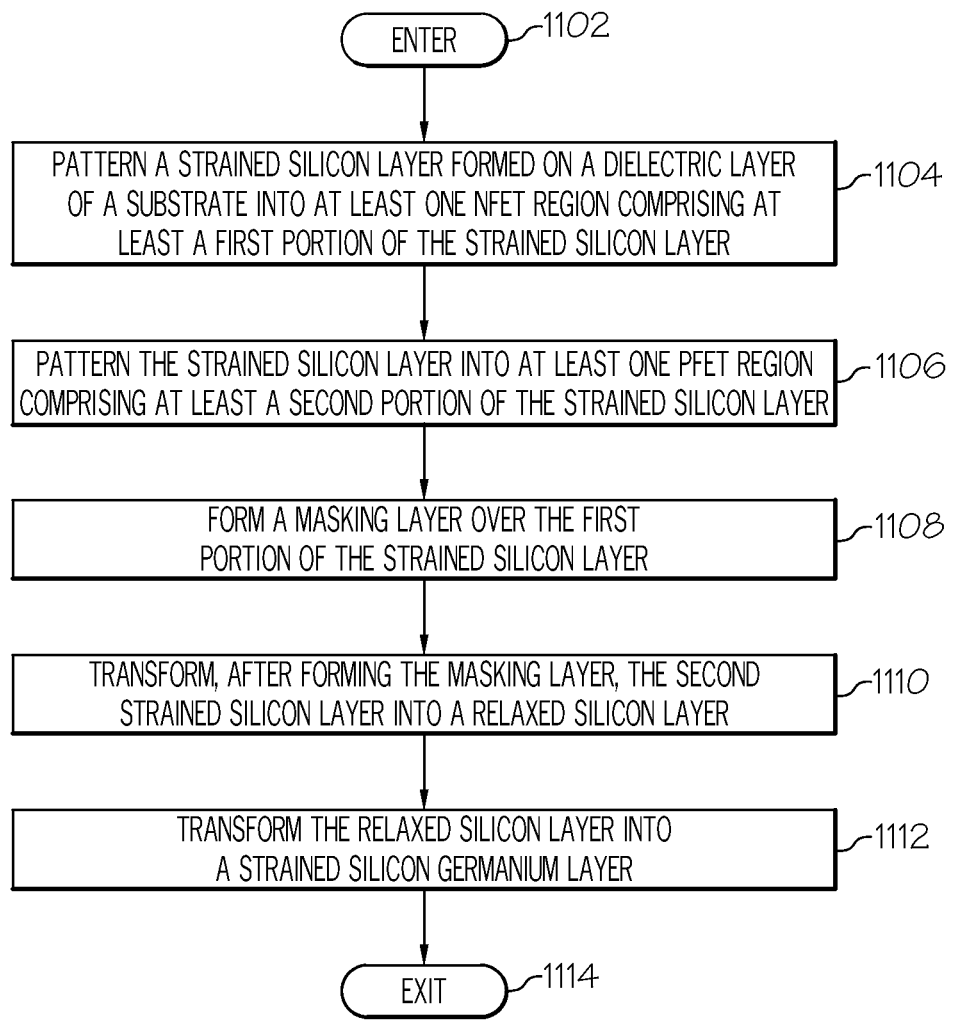
FIG. 11 is an operational flow diagram illustrating a process for fabricating field effect transistors according to one embodiment of the present invention.

FIG. 11 is an operational flow diagram illustrating a process fabricating field effect transistors. The operational flow diagram of FIG. 11 begins at step 1102 and flows directly to step 1104. A strained silicon layer 106 formed on a dielectric layer 104 of a substrate 102 is patterned into at least one NFET region 208 comprising at least a first portion of the strained silicon layer 106 and at least one PFET region 210 comprising at least a second portion of the strained silicon layer 106, at step 1104. A masking layer 212 is formed over the first portion of the strained silicon layer 106, at step 1106. After forming the masking layer 212, the second strained silicon layer is transformed into a relaxed silicon layer 106A, at step 1108. The relaxed silicon layer 106A is transformed into a strained silicon germanium layer 522, at step 1110. The control flow then exits at step 1112.

Figure 12:
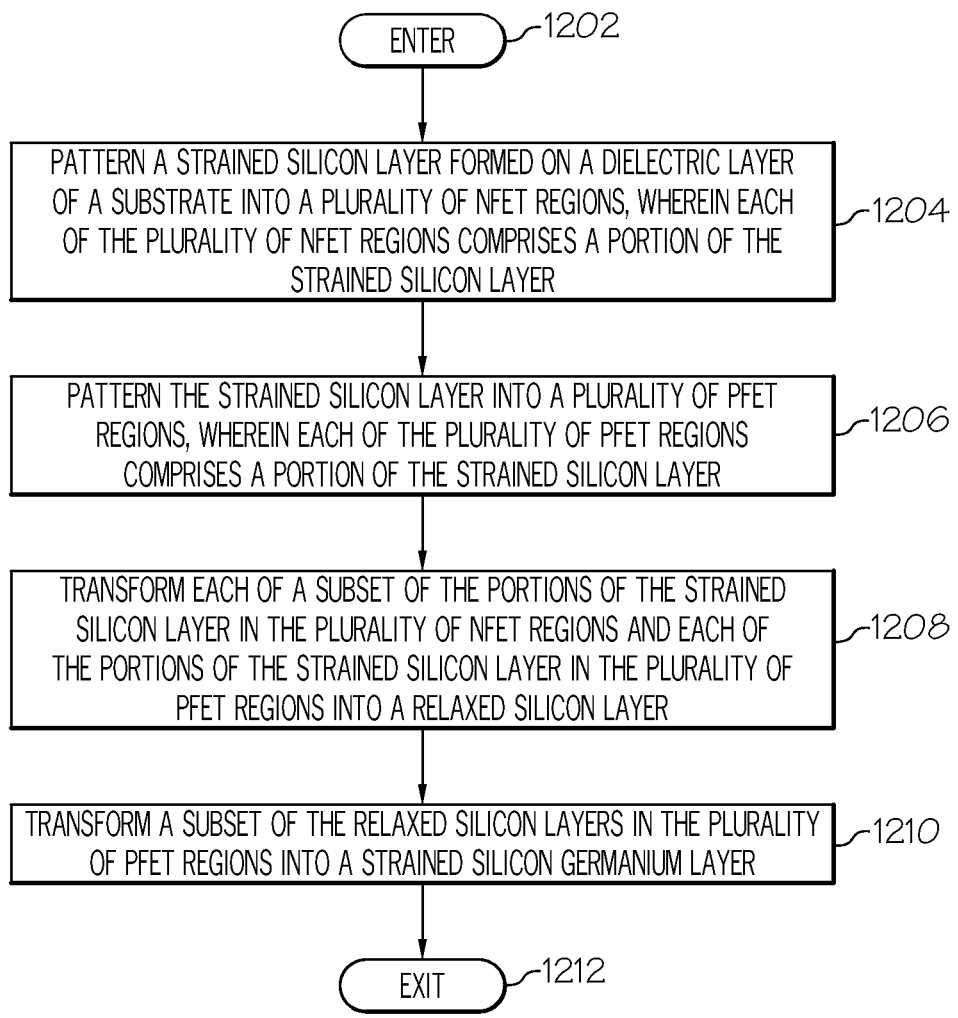
FIG. 12 is an operational flow diagram illustrating another process for fabricating field effect transistors according to another embodiment of the present invention.

FIG. 12 is an operational flow diagram illustrating another process fabricating field effect transistors. The operational flow diagram of FIG. 12 begins at step 1202 and flows directly to step 1204. A strained silicon layer 106 formed on a dielectric layer 104 of a substrate 102 is patterned into a plurality of NFET regions and a plurality of PFET regions, at step 1204. Each of the plurality of NFET regions and plurality of PFET regions comprises a portion of the strained silicon layer 106. Each of a subset of the portions of the strained silicon layer 106 in the plurality of NFET regions and each of the portions of the strained silicon layer 106 in the plurality of PFET regions is transformed into a relaxed silicon layer, at step 1206. A subset of the relaxed silicon layers in the plurality of PFET regions is transformed into a strained silicon germanium layer 922, at step 1208. The control flow then exits at step 1210.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating field effect transistors, the method comprising:
   patterning a strained silicon layer formed on a dielectric layer of a substrate into at least one NFET region comprising at least a first portion of the strained silicon layer;
   patterning the strained silicon layer into at least one PFET region comprising at least a second portion of the strained silicon layer;
   forming a masking layer over the first portion of the strained silicon layer;
   transforming, after forming the masking layer and while maintaining at least a top portion of the second portion of the strained silicon layer exposed, the second portion of the strained silicon layer into a relaxed silicon layer;
   epitaxially growing, after the second portion of the strained silicon layer has been transformed into the relaxed silicon layer, a silicon germanium layer on the relaxed silicon layer; and
   transforming, while maintaining at least a top surface of the silicon germanium layer exposed, the relaxed silicon layer and the silicon germanium layer into a strained silicon germanium layer.

2. The method of claim 1, wherein transforming the second portion of the strained silicon layer comprises:
   ion implantation onto the second portion of the strained silicon layer; and
   performing a thermal anneal on the second portion of the strained silicon layer.

3. The method of claim 2, wherein the ion implantation comprises implanting one of hydrogen and helium ions into the second portion of the strained silicon layer.

4. The method of claim 1, wherein transforming the relaxed silicon layer and the silicon germanium layer into a strained silicon germanium layer further comprises: annealing the silicon germanium layer and the relaxed silicon layer in an inert ambient; and diffusing, based on the annealing, germanium from the silicon germanium layer into the relaxed silicon layer.

5. The method of claim 1, wherein transforming the relaxed silicon layer and the silicon ~ermanium layer into a strained silicon germanium layer further comprises: annealing at least the silicon germanium layer in an oxidizing ambient; and oxidizing, based on the annealing, the silicon germanium layer, where the oxidizing drives germanium from the silicon germanium layer into the relaxed silicon layer.

6. The method of claim 1, further comprising:
   forming a gate stack on each of the first portion of the strained silicon layer and the strained silicon germanium layer, wherein the gate stack comprise a gate dielectric and a gate material formed on the gate dielectric; and
   forming a gate spacer surrounding the gate stack.

7. A method for fabricating field effect transistors, the method comprising:
   patterning a strained silicon layer formed on a dielectric layer of a substrate into a plurality of NFET regions, wherein each of the plurality of NFET regions comprises a portion of the strained silicon layer;

patterning the strained silicon layer into a plurality of PFET regions, wherein each of the plurality of PFET regions comprises a portion of the strained silicon layer;

transforming, while maintaining a top surface of a subset of the portions of the strained silicon layer in the plurality of NFET regions and a top surface of the portions of the strained silicon layer in the plurality of PFET regions exposed, each of the subset of the portions of the strained silicon layer in the plurality of NFET regions and each of the portions of the strained silicon layer in the plurality of PFET regions into a relaxed silicon layer;

epitaxially growing a silicon germanium layer on at least one of the relaxed silicon layers in the plurality of PFET regions; and transforming, while maintaining at least a top surface of the silicon germanium layer exposed, the at least one of the relaxed silicon layers in the plurality of PFET regions and the silicon germanium layer epitaxially grown on the at least one relaxed silicon layer into at least one strained silicon germanium layer.

8. The method of claim 7, further comprising:
forming, prior to transforming portions of the strained silicon layer into a relaxed silicon layer, a masking layer over at least one portion of the strained silicon layer in the plurality of NFET regions.

9. The method of claim 7, wherein transforming the subset of the portions of the strained silicon layer in the plurality of NFET regions and each of the portions of the strained silicon layer in the plurality of PFET regions comprises:
ion implantation onto each portion of the strained silicon layer in the subset and each portion of the strained silicon layer in the plurality of PFET regions; and
performing a thermal anneal on the subset and each portion of the strained silicon layer in the plurality of PFET regions.

10. The method of claim 9, wherein the ion implantation comprises implanting at least one of hydrogen and helium ions into the subset and each portion of the strained silicon layer in the plurality of PFET regions.

11. The method of claim 7, wherein transforming the subset of at least one the relaxed silicon layers in the plurality of PFET regions further comprises: annealing the silicon germanium layer and the relaxed silicon layer in an inert ambient; and diffusing, based on the annealing, germanium from the silicon germanium layer into the relaxed silicon layer.

12. The method of claim 7 wherein transforming the subset of at least one the relaxed silicon layers in the plurality of PFET regions further comprises: annealing at least the silicon germanium layer in an oxidizing ambient; and oxidizing, based on the annealing, the silicon germanium layer, where the oxidizing drives germanium from the silicon germanium layer into the relaxed silicon layer.

13. The method of claim 7, further comprising:
forming a high performance NFET device on at least one portion of the strained silicon layer in the plurality of NFET regions;
forming a low power NFET device on at least one relaxed silicon layer in the plurality of NFET regions;
forming a low power PFET device on at least one relaxed silicon layer in the plurality of PFET regions; and
forming high performance PFET device on the at least one strained silicon germanium layer in the plurality of PFET regions.

14. The method of claim 13, wherein the high performance NFET device comprises an electron mobility that is higher than an electron mobility of an NFET device with a relaxed silicon channel.

15. The method of claim 1, wherein a height of the strained silicon germanium layer is greater than a height of the first portion of the strained silicon layer in the NFET region.

16. The method of claim 7, wherein a height of each of the strained silicon germanium layers is greater than a height of each of the portions of the strained silicon layer in the plurality of NFET regions.

* * * * *